(12) United States Patent
Lanka et al.

(10) Patent No.: US 12,413,227 B2
(45) Date of Patent: Sep. 9, 2025

(54) METHOD AND SYSTEM FOR MITIGATING HOT CARRIER INJECTION EFFECT IN A SEMICONDUCTOR CIRCUIT

(71) Applicant: XILINX, INC., San Jose, CA (US)

(72) Inventors: Sasi Rama Subrahmanyam Lanka, Challapalli (IN); Hari Bilash Dubey, Hyderabad (IN); Vss Prasad Babu Akurathi, Hyderbad (IN)

(73) Assignee: XILINX, INC., San Jose, CA (US)

( * ) Notice: Subject to any disclaimer, the term of this patent is extended or adjusted under 35 U.S.C. 154(b) by 190 days.

(21) Appl. No.: 18/110,772

(22) Filed: Feb. 16, 2023

(65) Prior Publication Data
US 2024/0283448 A1 Aug. 22, 2024

(51) Int. Cl.
H03K 17/51 (2006.01)
H03K 3/356 (2006.01)
H03K 17/687 (2006.01)
H03F 3/45 (2006.01)

(52) U.S. Cl.
CPC ............ *H03K 17/6872* (2013.01); *H03K 3/356113* (2013.01); *H03F 3/45179* (2013.01)

(58) Field of Classification Search
CPC ...... H03K 17/06; H03K 17/063; H03K 17/10; H03K 17/102; H03K 17/12; H03K 17/122; H03K 17/14; H03K 17/145; H03K 17/16; H03K 17/165; H03K 17/51; H03K 17/56; H03K 17/687; H03K 17/6871; H03K 17/6872; H03K 3/356113; H03F 3/45179
See application file for complete search history.

(56) References Cited

U.S. PATENT DOCUMENTS

| | | | |
|---|---|---|---|
| 9,998,120 B1 | 6/2018 | Ekambaram et al. | |
| 10,484,041 B2 | 11/2019 | Ekambaram et al. | |
| 10,608,618 B1 | 3/2020 | Ekambaram et al. | |
| 2010/0141324 A1* | 6/2010 | Wang | H03K 19/018521 327/333 |

OTHER PUBLICATIONS

U.S. Appl. No. 16/511,925, filed Jul. 15, 2019 Entitled "Circuit for and Method of Implementing IO Connections in an Integrated Circuit Device".
U.S. Appl. No. 17/747,387 Entitled "Voltage Sensing and Biasing for Wide Supply Range Integrated Circuit Transceivers".
U.S. Appl. No. 18/082,921, filed Dec. 16, 2022 Entitled "Method for Implementing an I/O Buffer".

* cited by examiner

*Primary Examiner* — Long Nguyen
(74) *Attorney, Agent, or Firm* — Patterson + Sheridan, LLP

(57) ABSTRACT

The Hot Carrier Injection effect is a phenomenon present in semiconductor devices, where charges are trapped in the gate oxide region and degrade the device. Hot carrier Injection (HCI) is one of the major problems in lower voltage technologies due to lower voltage tolerance limits of MOS devices. Due to this HCI effect, designing high voltage, wide range (i.e., supply voltage ranges: 3.3 v, 2.5 v, and 1.8 v) I/O buffers has become challenging. The HCI effect is common in input/output (I/O) buffers that use bias generation circuits for wide voltage ranges. Disclosed here are methods and systems employed to provide reliable bias generation in an I/O buffer or other semiconductor circuit. This limits the device drain to source voltage (Vds) in the bias circuits and I/O buffer so as to mitigate the hot carrier Injection (HCI) effect.

20 Claims, 8 Drawing Sheets

METHOD AND SYSTEM FOR MITIGATING HOT CARRIER INJECTION EFFECT IN A SEMICONDUCTOR CIRCUIT

TECHNICAL FIELD

Examples of the present disclosure generally relate to hot carrier injection effect mitigating circuits, and, in particular, to a bias generation circuit for mitigating the hot carrier injection effect in various semiconductor circuits, including amplifiers and high voltage Input/Output (I/O) buffers.

BACKGROUND

In short channel devices at higher drain to source voltage (Vds), the source to drain electric field will be higher than the electric field in a lower drain to source voltage. Due to this higher electric field, carriers attain high velocity then get trapped in the gate oxide region. These trapped charges degrade the threshold voltage of the device and hence the device saturation current is also degraded. This phenomenon of trapping charges in the gate oxide region is called the Hot Carrier Injection (HCI) effect. HCI is one of the major problems in lower voltage technologies due to lower voltage tolerance limits of MOS devices. Due to this HCI effect, designing high voltage, wide range (i.e., supply voltage ranges: 3.3 v, 2.5 v, and 1.8 v) I/O buffers, amplifiers, and other semiconductor circuits has become challenging.

SUMMARY

Methods and systems for mitigating Hot Carrier Injection effects in various semiconductor circuits, including I/O buffers and amplifiers, are disclosed herein. These methods may comprise detecting VCCO voltage levels in a semiconductor circuit via a VCCO detection circuit and generating a plurality of bias signals. The bias signals are applied to semiconductor circuit to protect MOS transistors in the high voltage mode. In the process of generating different bias signals, some of the devices in the bias generation circuits will suffer from HCI effect. The proposed solution dynamically adjusts the BASE_Node voltage (also referred to as a reference node voltage) of the semiconductor circuits, depending upon THE VCCO value, and thus mitigates the HCI effect.

These and other examples may be understood with reference to the following detailed description.

BRIEF DESCRIPTION OF THE DRAWINGS

So that the manner in which the above recited features can be understood in detail, a more particular description, briefly summarized above, may be had by reference to example implementations, some of which are illustrated in the appended drawings. It is to be noted, however, that the appended drawings illustrate only typical example implementations and are therefore not to be considered limiting of its scope.

To facilitate understanding, identical reference numerals have been used, where possible, to designate identical elements that are common to the figures. It is contemplated that elements of one example may be beneficially incorporated in other examples.

DETAILED DESCRIPTION

Figure 1:
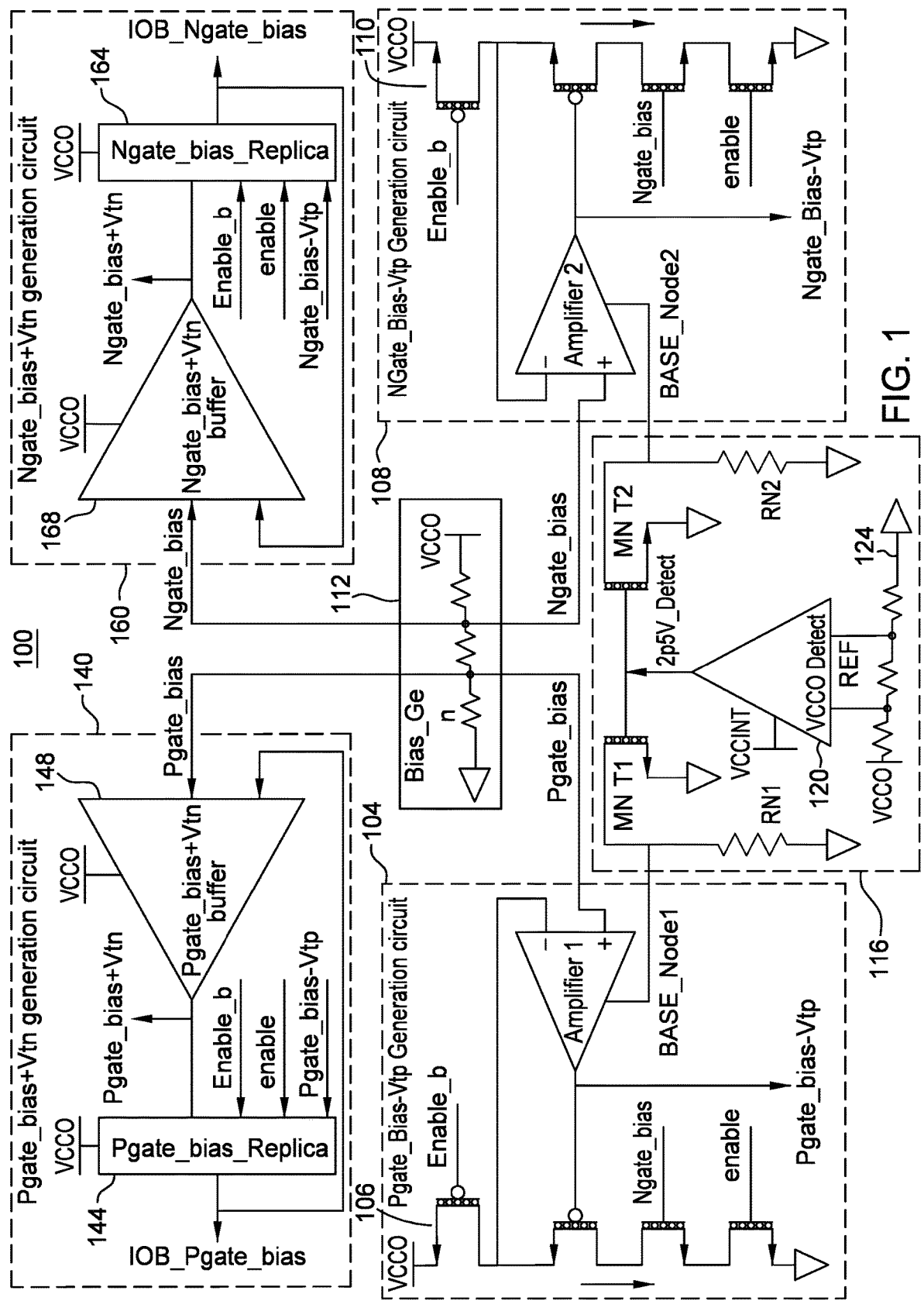
FIG. 1 is a schematic diagram of an example of a New Bias Generation circuit.

Various features are described hereinafter with reference to the figures. It should be noted that the figures may or may not be drawn to scale and that the elements of similar structures or functions are represented by like reference numerals throughout the figures. It should be noted that the figures are only intended to facilitate the description of the features. They are not intended as an exhaustive description of the description or as a limitation on the scope of the claims. In addition, an illustrated example need not have all the aspects or advantages shown. An aspect or an advantage described in conjunction with a particular example is not necessarily limited to that example and can be practiced in any other examples even if not so illustrated, or if not so explicitly described.

Disclosed herein are methods and systems employed to provide reliable bias generation and limit device source to drain voltage (Vds) current leakage in an input/output (I/O) buffer, amplifier, or other semiconductor circuit. The bias generation methods disclosed herein have the effect of mitigating the Hot Carrier Injection (HCI) effect common in multiple I/O buffer circuits, amplifiers, and other semiconductor circuits using bias generation circuits for wide voltage ranges.

These methods may comprise detecting VCCO voltage levels in a semiconductor circuit via a VCCO detection circuit and generating a plurality of bias signals. The bias signals are applied to semiconductor circuits to protect MOS transistors in the high voltage mode. In the process of generating different bias signals, some of the devices in the bias generation circuits could potentially suffer from the HCI effect. To mitigate the HCI effect, the BASE_Node voltage (also referred to as a reference node voltage) of the semiconductor circuits is generated and dynamically adjusted.

High voltage, general purpose Input/Output (I/O) circuits, and other semiconductor circuits may typically operate using several separate voltages, namely VCCINT (the core power supply) and VCCO (the I/O buffer power supply). In some cases a VCCAUX power supply (the auxiliary power supply used to protect the devices) is also used.

The term "high voltage" in this disclosure refers to voltages 1.98 v or greater (i.e. 1.8+/10%) when 1.8 v tolerant MOS transistors are used in the design. "High voltage" I/O design involves designing various circuits like transmitters (Tx), receivers (Rx), and also bias circuits for providing safe bias voltages to the transmitters and receivers.

FIG. 1 is a top-level schematic diagram of an example of a New Bias Generation Circuit 100. The New Bias Generation Circuit 100 detects VCCO voltage levels in a semiconductor circuit via a VCCO detection circuit, and generates a plurality of bias signals. The bias signals are applied to semiconductor circuits to protect MOS transistors in the high voltage mode by generating and dynamically adjusting the BASE_Node voltage (also referred to as a reference node voltage) of the semiconductor circuits, which mitigates potential HCI effects.

Block 140 illustrates the Pgate_bias+Vtn generation circuit. In block 140, a Pgate_bias+Vtn buffer 148 receives the Pgate_bias signal from the New Bias Generation Circuit 100. The output of the Pgate_bias+Vtn buffer 148 is Pgate_bias+Vtn. This output is coupled to the Pgate_bias_Replica circuit 144, whose output is the IOB_Pgate_bias signal. The Pgate_bias_Replica circuit 144 receives the output of the Pgate_bias+Vtn buffer, and also the Enable_b, enable, and Pgate_bias−Vtp signals, and transmits the IOB_Pgate_bias signal.

Block 160 illustrates the Ngate_bias+Vtn generation circuit. In block 160, an Ngate_bias+Vtn buffer 168 receives the Ngate_bias signal from the New Bias Generation Circuit 100. The output of the Ngate_bias+Vtn buffer 168 is Ngate_bias+Vtn. This output is coupled to the Ngate_bias_Replica circuit 164, whose output is the IOB_Ngate_bias signal. The Ngate_bias_Replica circuit 164 receives the output of the Ngate_bias+Vtn buffer, and also the Enable_b, enable, and Ngate_bias−Vtp signals, and transmits the IOB_Ngate_bias signal.

Block 104 illustrates the Pgate_bias−Vtp generation circuit. Block 104 generates the Pgate_bias−Vtp signal. Block 104 comprises Amplifier 1 and a PMOS NMOS transistor stack 106. The transistors in transistor stack 106 receive the Ngate_bias, Enable_b and enable signals. The feedback mechanism of this unity gain amplifier (UGB) ensures that the output of Amplifier 1 settles at Pgate_bias−Vtp, where Vtp is the threshold voltage of the PMOS transistor.

Amplifier 1 in the loop with transistor stack 106 produces the Pgate_bias−Vtp signal. The Pgate_bias−Vtp signal is sent to Pgate_bias_Replica 144 of Block 140.

The output of the Pgate_bias−Vtp generation circuit Block 104 is the Pgate_bias−Vtp signal which is utilized to reproduce the IOB_Pgate_bias signal.

Block 108 illustrates the Ngate_bias−Vtp generation circuit. The transistor stack 110 in Block 108 receives the Ngate_bias, Enable_b and enable signals. Block 108 consists of Amplifier 2 and a combination of the PMOS NMOS transistor stack 110. The feedback mechanism of this unity gain amplifier (UGB) ensures that the output of Amplifier 2 settles at Ngate_bias−Vtp, where Vtp is the threshold voltage of the PMOS transistor.

Amplifier 2 in the loop with transistor stack 110 produces the Ngate_bias−Vtp signal. The Ngate_bias−Vtp signal is sent to Ngate_bias_Replica 164 of Block 160 to reproduce the IOB_Pgate_bias signal.

Block 112 is a block diagram of a New Bias Generation circuit. The resistor divider circuits in Block 112 deliver the Pgate_bias signal to the Pgate_bias+Vtn generation circuit Block 140 and to the Pgate_bias−Vtp generation circuit Block 104. Resistor divider circuit Block 112 also delivers the Ngate_bias signal to the Ngate_bias+Vtn generation circuit Block 160, and also to the Ngate_bias−Vtp generation circuit Block 108.

Block 116 is a VCCO Detect circuit that detects VCCO voltage levels in a semiconductor circuit.

The resistor ladder 124 provides an input signal to the VCCO Detect circuit 120. The output of the VCCO Detect circuit 120 is the 2p5V_Detect signal, which is delivered to the MN T1 and MN T2 transistors.

In Block 116, a reference voltage REF is used to compare the VCCO voltage. In Block 116, a percentage of the VCCO voltage from the resistor ladder 124 is compared against the REF voltage by the VCCO Detect block 120 to identify the range of the VCCO Voltage.

Transistor MN T1 bypasses resistor RN1 in 2.5 v mode.

Transistor MN T2 bypasses resistor RN2 in 2.5 v mode.

Resistor RN1 is placed between BASE_Node1 voltage and ground. "BASE_Node" voltages are also described as "reference node voltages" in the semiconductor field and in this disclosure. During 3.3 v mode, 2p5 v_Detect will become logic 0 and resistor RN1 turns off transistor MN T1. Under this condition the current from Amplifier1 passes through resistor RN1. This will produce the BASE_Node1 voltage. During 2.5 v mode, 2p5 v_Detect will become logic 1 and turns on the transistor MN T1. Under this condition resistor RN1 is bypassed by the transistor MN T1. This will pull down BASE_Node1 voltage to ground.

Resistor RN2 is connected between BASE_Node2 and ground. During 3.3 v mode, 2p5 v_Detect will become logic 0 and turns off transistor MN T2. Under this condition, the current from Amplifier 2 passes through resistor RN2. This will give rise to the BASE_Node2 voltage. During 2.5 v mode, 2p5 v_Detect will become logic 1 and turn on the transistor MN T2. Under this condition, resistor RN2 is bypassed by transistor MN T2. This will pull down the BASE_Node2 voltage to ground.

Figure 2:
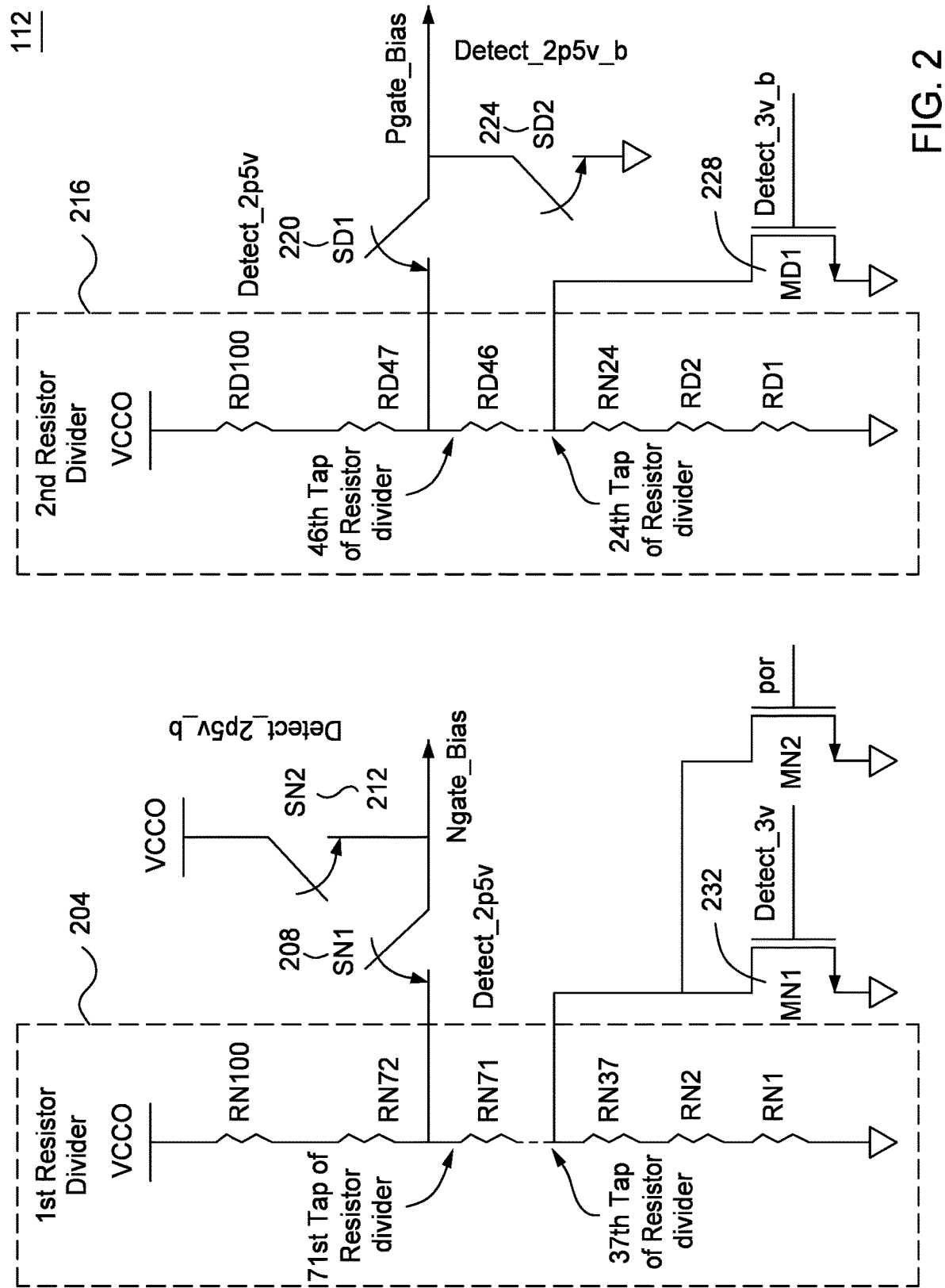
FIG. 2 is a schematic diagram of an example of a New Bias Generation circuit.

FIG. 2 illustrates an example, according to one example, of a New Bias Generation Circuit 100. Pgate_Bias and Ngate_Bias are generated as shown in FIG. 2.

The New Bias Generation Circuit 100 in different modes (supply modes) is described below. In some examples, the New Bias Generation Circuit 100 will have two resistor divider networks 204, 216.

Resistor divider networks 204, 216 provide bias voltages for Ngate_Bias and Pgate_Bias. A first resistor divider network 204 comprises at least 10 resistors. In some examples, 100 resistors, RN1 to RN100, are connected in series in resistor divider network 204. A second resistor divider network 216 comprises at least 10 resistors. In some examples, 100 resistors, RD1 to RD100, are connected in series in resistor divider network 216.

Bias Generation in 1.8V Mode: During 1.8V mode, detect_2p5 v is equal to logic zero and detect_2p5 v_b is equal to logic one. Under this condition, switches SN1 208, SD1 220 are open and SN2 212, SD2 224 are closed. As SN2 212, SD2 224 are closed, Ngate_bias is shorted to VCCO (~1.8V) and Pgate_Bias is shorted to ground.

Bias Generation in 2.5V Mode: During 2.5 v mode detect_2p5 v, Detect_3 v_b is equal to logic one and Detect_2p5 v_b, Detect_3 v are equal to logic zero. Under this condition switches SN1 208, SD1 220 are closed and SN2 212, SD2 224 are open. As SN1 208, SD1 220 are closed, the 71st tap of the first resistor divider network 204 is shorted to Ngate_Bias and the 46th tap of the second resistor divider network 216 is shorted to Pgate_bias. The Detect_3 v_b signal is logic high and turns on transistor MD1 228. When turned on, transistor MD1 228 bypasses 24 resistors in the second resistor divider network 216. Under this condition, Ngate_Bias=71% of VCCO (~1.78V for VCCO-2.5 v) and Pgate_bias=29% of VCCO (~0.73V for VCCO=2.5V).

Bias generation in 3.3V Mode: During 3.3 v mode, detect_2p5 v, Detect_3 v are equal to logic one and Detect_2p5 v_b, Detect_3 v_b are equal to logic zero. Under this condition switches SN1 208, SD1 220 are closed and SN2 212, SD2 224 are open. As SN1 208, SD1 220 are closed, the 71st tap of the first divider 204 is shorted to Ngate_Bias and the 46th tap of the second resistor divider network 216 is shorted to Pgate_bias. The Detect_3 v signal is logic high and turns on transistor MN1 232. When turned on, transistor MN1 232 bypasses 37 resistors in the first resistor divider network 204. Under this condition, Ngate_Bias-54% of VCCO (~1.78 v for VCCO-3.3V) and Pgate_bias=46% of VCCO (~1.52V for VCCO=3.3V).

Generation of bias signals by this method has certain limitations. As these biases (Ngate_Bias and Pgate_bias) are generated from the first and second resistor divider networks 204, 216, the bias value is highly dependent on the nature of the load. If a load (i.e., whenever these bias signals are connected in I/O) draws current from the bias signal, the bias value changes accordingly. The change in the bias voltages can cause performance degradation and at times may cause reliability issues as well. Placing a unity gain I/O buffer on these biases (with high load current capability) is one solution but is not efficient.

Figure 3:
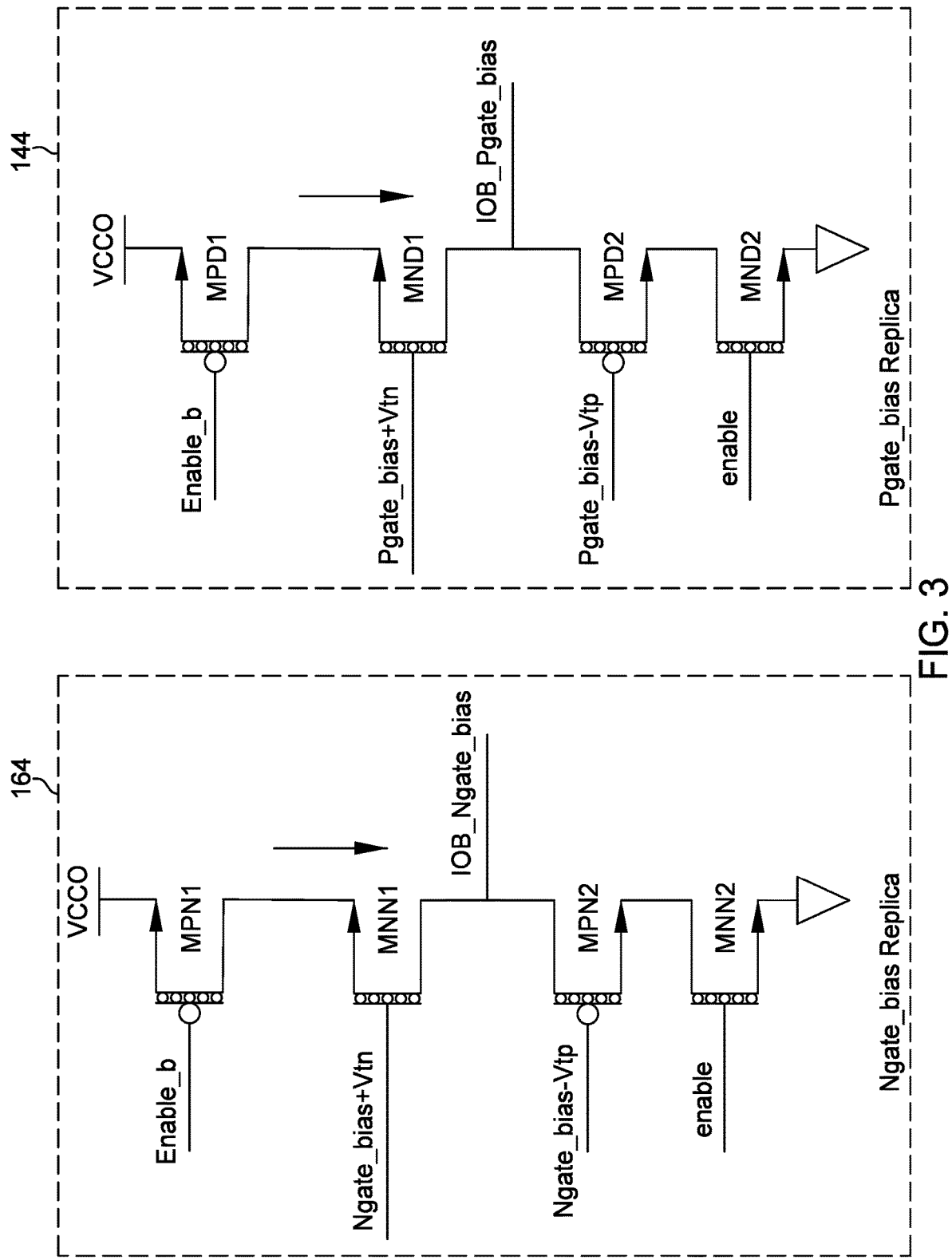
FIG. 3 is a schematic diagram of an example of an Ngate Bias Replica circuit and a Pgate Bias Replica circuit.

FIG. 3 illustrates an example, according to one example, of an Ngate_bias_Replica circuit 164 and a Pgate_bias_Replica circuit 144.

Ngate_bias_Replica circuit 164 and Pgate_bias_Replica circuit 144 can be placed within an Input/Output (I/O) buffer. Topologically both replica circuits 164, 144 use the same design scheme. In the Ngate_bias_Replica circuit 164 there are four transistors, MPN1, MPN2, MNN1 and MNN2. MPN1, MPN2 are PMOS transistors, while MNN1, MNN2 are NMOS transistors. In 3.3 volt mode, the Pgate_Bias=~1.5 v and Ngate_bias=~1.8 v. In the Ngate_bias_Replica circuit 164, MPN1 and MNN2 are turned on with Vgs=1.8 v. The other two transistors MNN1 and MPN2 are at the edge of cut-off region as their Vgs is close to the threshold voltage of the respective devices.

In a case where the IOB_Ngate_bias value goes lower than 1.8 v, then the transistor MNN1 Vgs increases and it turns ON. As MPN1 and MNN1 are turned on there will be a current from VCCO. This current from VCCO restores the value of IOB_Ngate_Bias. Once IOB_Ngate_Bias reaches 1.8 v the transistor MNN1 turns off and also the current path to VCCO.

In the other case, where the IOB_Ngate_Bias value increases more than 1.8 v, under this condition MPN2 turns ON and provides a current path between IOB_Ngate_Bias and ground. Due to this current path to ground the value of IOB_Ngate_Bias goes down. Once IOB_Ngate_Bias reaches 1.8 v the transistor MPN2 turns OFF and hence the current path to the ground as well. In this way the push-pull mechanism of the regeneration circuit keeps the IOB_Ngate_Bias value at 1.8 v.

The operation of the Pgate_bias_Replica circuit 144 is the same as the operation of the Ngate_bias_Replica circuit 164.

In order to regenerate NGate_Bias and Pgate_Bias locally within the I/O buffer (or other semiconductor circuit), the design requires four bias signals NGate_Bias-Vtp, Ngate_Bias+Vtn, Pgate_Bias-Vtp and Pgate_Bias+Vtn.

Vtp is the threshold voltage of a PMOS transistor. For example, it is the threshold voltage of transistor MPN2 of Block 164 or the threshold voltage of transistor MPD2 of Block 144.

Vtn is the threshold voltage of an NMOS transistor. For example, it is the threshold voltage of transistor MNN1 of Block 164 or the threshold voltage of transistor MND1 Of Block 144.

Enable_b is one of the control signals and it is the compliment of the signal enable. It enables/disables the different bias generation amplifiers, i.e. it enables/disables Blocks 164, 144 and transistor stacks 110,106 of FIG. 1. In 3.3 v mode and 2.5 v mode, the voltage Enable_b is approximately equal to VCCO-1.8 v, and the enable signal is approximately equal to 1.8 v.

NGate_Bias-Vtp is one of the bias voltages used to reproduce IOB_Ngate_bias. The voltage of NGate_Bias-Vtp is approximately equal to 1.8-Vtp volts, where Vtp is the threshold voltage of the PMOS transistor.

Ngate_Bias+Vtn is one of the bias voltages used to reproduce IOB_Ngate_bias. The voltage of NGate_Bias+Vtn is approximately equal to 1.8+Vtn volts, where Vtn is the threshold voltage of the NMOS transistor.

Pgate_Bias-Vtp is one of the bias voltages used to reproduce IOB_Pgate_bias. The voltage of PGate_Bias-Vtp is approximately equal to (VCCO-1.8-Vtp) volts, where Vtp is the threshold voltage of the PMOS transistor.

Pgate_Bias+Vtn is one of the bias voltages used to reproduce IOB_Pgate_bias. The voltage of PGate_Bias+Vtn is approximately equal to (VCCO-1.8+Vtn) volts, where Vtn is the threshold voltage of the NMOS transistor.

Figure 4:
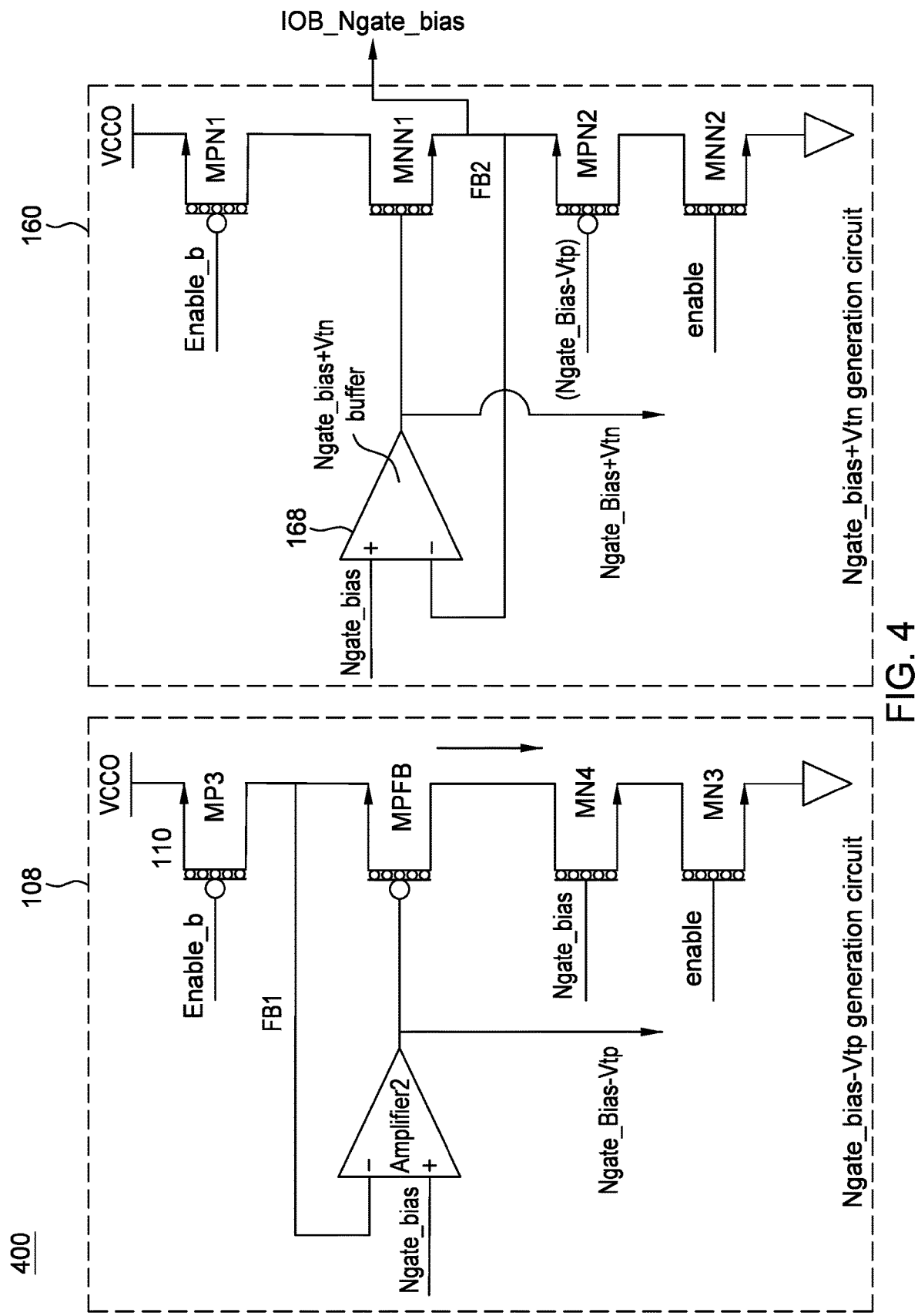
FIG. 4 is a schematic diagram of an example of an Ngate Bias-Vtp Generation circuit and an Ngate Bias+Vtn Generation circuit.

FIG. 4 400 illustrates an example, according to one example, of an NGate_Bias-Vtp Generation circuit 108 and an Ngate_Bias+Vtn Generation circuit 160.

Block 108 illustrates a block diagram of the Ngate_bias–Vtp generation circuit. Block 108 comprises amplifier circuit Amplifier 2 in a loop with PMOS, NMOS transistor stack 110 (MP3, MPFB, MN4 and MN3). Amplifier 2 operates from the VCCO power supply. Ngate_bias is input to Amplifier 2 from the New Bias Generation Circuit 100. Enable and Enable_b are the control signals and are complementary to each other. In high voltage mode, Block 108 will be enabled, making Enable_b logic 0 (i.e. the voltage of Enable_b=(VCCO-1.8) V approximately) and enable as logic 1 (voltage of enable=1.8 v approximately). The four transistors MP3, MPFB, MN4 and MN3 in block 108 are connected to VCCO. Under this condition the amplifier is enabled, and due to feedback action the voltage of FB1 net settles to Ngate_bias value and hence the gate voltage of MPFB will settles to Ngate_bias-Vtp. The output of the Ngate_bias-Vtp generation circuit 108 is the Ngate_bias-Vtp signal and is useful to reproduce the IOB_Ngate_bias Block 160 illustrates the Ngate_bias+Vtn generation circuit. In this circuit the Ngate_bias+Vtn buffer 168 is in loop with Ngate_bias_Replica 164. In block 160, the Ngate_bias+Vtn buffer 168 receives the Ngate_bias signal from the New Bias Generation Circuit 100. In high voltage mode, the Block 160 circuit 160 will be enabled and will make the Enable_b signal logic 0 (i.e. the voltage of Enable_b=(VCCO-1.8) volts approximately), and it makes the enable signal logic 1 (voltage of enable=1.8 v approximately). Under this condition, due to the feedback action, FB2 settles to Ngate_bias, which causes the gate of MNN1 to settle at Ngate_bias+Vtn. The gate of MNN1, which is the output of the Ngate_bias+Vtn buffer 168, is the Ngate_bias+Vtn signal which serves to reproduce IOB_Ngate_bias.

Figure 5:
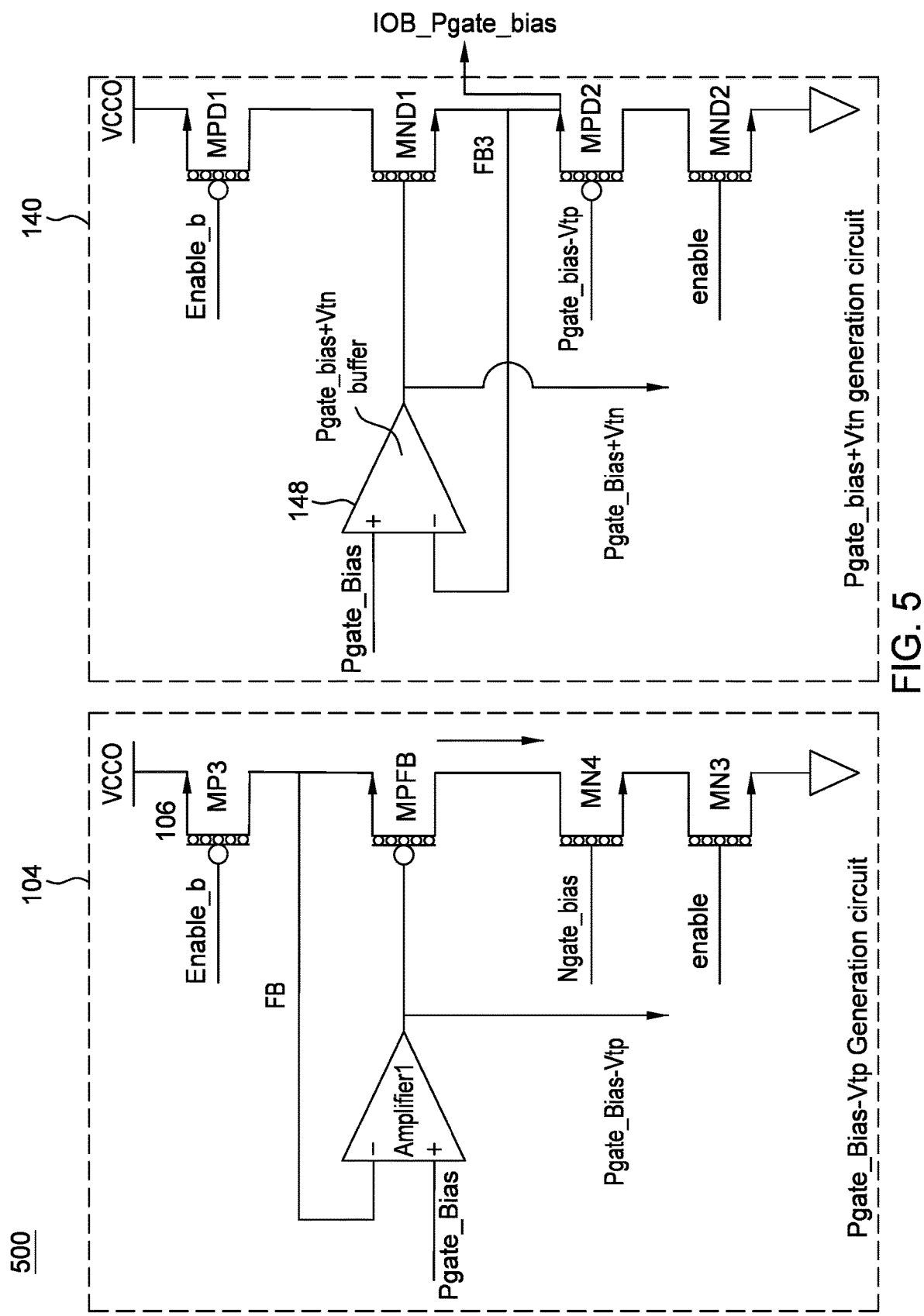
FIG. 5 is a schematic diagram of an example of a Pgate Bias-Vtp Generation circuit and a Pgate Bias+Vtn Generation circuit.

FIG. 5 500 illustrates an example, according to one example, of a Pgate Bias–Vtp Generation circuit 104 and a Pgate Bias+Vtn Generation circuit Block 140.

Block 104 illustrates a block diagram of the Pgate_bias-Vtp generation circuit. Block 104 comprises amplifier circuit Amplifier 1 in a loop with the PMOS, NMOS transistor stack 106 (MP3, MPFB, MN4 and MN3). Amplifier 1 operates from the VCCO power supply. Pgate_bias, received from Block 112, is input to Amplifier 1. Enable and Enable_b are the control signals and are complementary to each other. In high voltage mode, the Block 104 circuit will be enabled. This will make Enable_b logic 0 (i.e. the voltage of Enable_b=(VCCO−1.8) V approximately), and enable will be logic 1 (voltage of enable=1.8 v approximately). The four transistor stack 106 of MP3, MPFB, MN4 and MN3 in block 104 is connected to the VCCO power supply. Under this condition, Amplifier 1 is enabled and due to feedback action, the voltage of FB net settles to Pgate_bias value, and hence the gate voltage of MPFB will settles to Pgate_bias−Vtp. The output of the Pgate_bias−Vtp generation circuit 104 is the Pgate_bias−Vtp signal and is useful to reproduce the IOB_Pgate_bias.

Block 140 illustrates the Pgate_bias+Vtn generation circuit. In the Block 140 circuit, the Pgate_bias+Vtn buffer 148 is in a loop with the Pgate_bias_Replica 144. The Pgate_bias+Vtn buffer 148 receives the Pgate_bias signal from the resistor divider circuit Block 112. In high voltage mode, the Block 140 circuit will be enabled and will make Enable_b logic 0 (voltage of Enable_b=(VCCO−1.8) V approximately), and will make enable as logic 1 (voltage of enable=1.8 v approximately). Under this condition, the transistors MPD1, MPD2 and MND2 are turned on, and due to feedback action FB3 net settles to Pgate_bias, which makes the gate of MND1 settle at Pgate_bias+Vtn. The gate of MND1, connected to the output of the Pgate_bias+Vtn buffer 148, is the Pgate_bias+Vtn signal which serves to reproduce IOB_Pgate_bias.

The design of these amplifiers without reliability issues is a challenge. The following section explains the design complexity and how the reliability issues caused by HCI are solved with the novel design solutions of the Pgate_Bias-Vtp and Ngate_bias−Vtp circuits.

Figure 6:
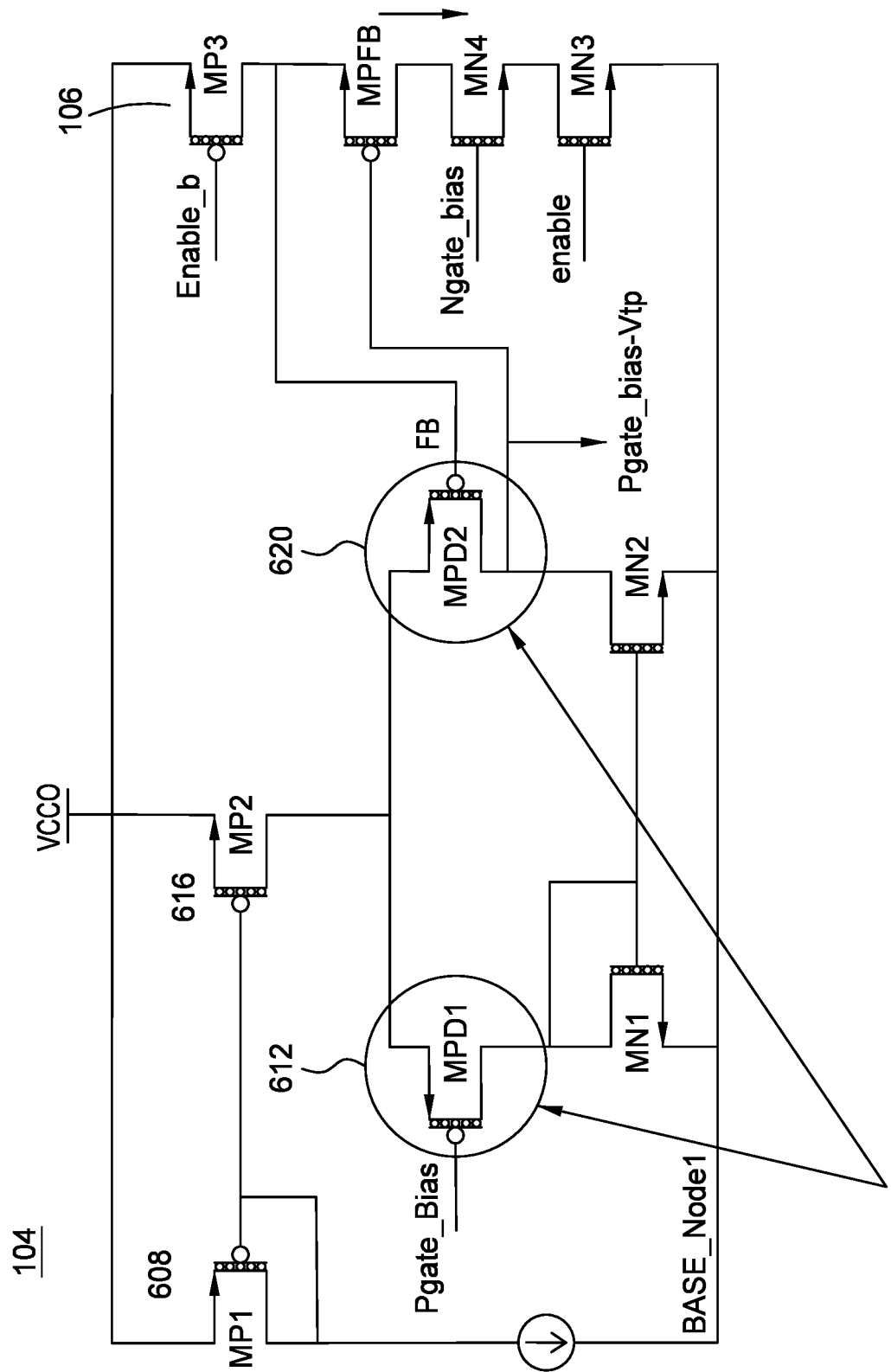
FIG. 6 is a schematic diagram of an example of a Pgate Bias-Vtp Generation circuit.

FIG. 6 illustrates an example, according to one example, of a Detailed View of a Pgate Bias-Vtp Generation circuit 104.

The Pgate Bias-Vtp Generation circuit 104 comprises a PMOS differential amplifier with NMOS transistor load devices MN1 and MN2 along with transistor stack 106. Transistors MP1 608 and MP2 616 are the current mirror devices and provide bias current to the differential amplifier. Transistors MPD1 612 and MPD2 620 are the input devices to the differential amplifier which are impacted by the Hot Carrier Injection (HCI) effect. The feed-back is tapped from the source of the transistor MPFB (FB Net) transistor.

The FB is the feedback connection from the drain of transistor MP3 to the gate of transistor MPD2 620. When the differential amplifier is enabled due to the feedback effect of the differential amplifier, the net FB settles to the value of Pgate_Bias (VCCO−1.8 v). As the source of the MPFB transistor settles at Pgate_bias, the gate of that transistor settles to Pgate_Bias-Vtp which is a desired bias value.

In 2.5 v mode, VCCO can go as low as 2.325 (VCCO−7%), then the Pgate_Bias value=0.525 v (2.325−1.8) and the drain of MN2=0.525−Vtp (where Vtp is the threshold voltage of the PMOS transistor). To keep the transistor MN2 in saturation, the gate voltage of MN1 and MN2 should be as low as possible (close to the threshold voltage of the PMOS). The gate voltage of MPD1=vcoo−1.8 v and drain voltage of MPD1=Vtpn+VODN (where VODN is the overdrive of the MN1). This bias condition puts the source node of the MPD1 612 at VCCO−1.8+Vtp+VODp. Now the VDS of MPD1 612 is expressed as:

$V_{DS}$ of MPD1=$V_{DMPD1}$−$V_{SMPD1}$=Vtn+$V_{ODN}$−(VCCO−1.8+|Vtp|+VODP)=VCCO−1.8+Vtdiff (Vtdiff=threshold voltage difference of PMOS and NMOS).

In 3.3 volt mode, the VCCO can go as high as 3.465 (VCCO+5%). When VCCO=3.465 and under skew process conditions, the $V_{DS}$ of MPD1 can go up to 1.72V. The $V_{DS}$ limit of a MOS transistor under saturation condition is ~1.5 v. If the $V_{DS}$ of a PMOS transistor crosses 1.5V, the Idsat (i.e. the saturation current of the device) will degrade more than 5%, which is the acceptable limit for reliable operation. So to meet the HCI Degradation limits of the MOS transistor, the $V_{DS}$ of the device must be less than 1.5 v. The differential amplifier should be designed in such a way that in all the MOS transistors (1.8 v devices), the $V_{DS}$ voltage should be less than 1.5 v. In the Pgate_Bias−Vtp bias amplifier, the transistor MPD1 struggles with the HCI effect as its $V_{DS}$ is more than 1.5 v in 3.3 v mode.

To solve this issue, the BASE_Node1 voltage (i.e., a reference node voltage) should be raised by ~200 mv in 3.3 v mode so that the $V_{DS}$ of MPD1 will be less than 1.5 v. If the differential amplifier is designed to keep the BASE_Node1 at 200 mv, under 2.5 v mode the transistor MN2 will be out of saturation. To meet the performance of the differential amplifier without Idsat degradation (due to the HCI effect), the BASE_Node1 voltage should dynamically change according to the supply voltage mode.

In FIG. 1, the resistor RN1 and the MOS transistor MN T1 of Block 116, and the VCCO Detect circuit 120 of Block 116 are used to adjust the BASE_Node1 voltage dynamically (i.e. BASE_Node1 voltage=0 v in 2.5 v mode and ~250 mv in 3.3 v Mode). The VCCO Detect circuit 120 detects the voltage mode of the I/O buffer. The 2.5 v_Detect signal is a VCCINT domain signal. Its logic value is equal to "1" when the I/O is in 2.5 Vmode, and its logic value is "0" in 3.3 v mode. In 3.3 v mode, the 2.5 v_Detect signal is logic zero and turns off MN T1 of Block 116. Under this condition, the current from the differential amplifier (FIG. 7, MN1 732 and MN2 742) flows through RN1 and raises the BASE_Node1 voltage. The RN1 value is chosen in such a way that the BASE_Node1 voltage is approximately equal to 250 m (typically) in 3.3 v mode. In 2.5 v I/O mode, the signal 2.5 v_Detect is at logic high and turns on the transistor MN T1.

As the transistor MN T1 of Block 116 is ON, it bypasses the resistor RN1 of Block 116 and keeps the BASE_Node1 voltage approximately at ground value. Due to this dynamic change in the BASE_Node1 voltage, the $V_{DS}$ of all devices (under saturation) are well within the reliability limit and hence the Idsat degradation due to the HCI effect is mitigated.

In the Pgate Bias−Vtp Generation circuit 104, the HCI effect is mitigated by limiting the drain to source voltages of all MOS transistors below 1.5 v and this is achieved by dynamically changing the BASE_node1 voltage according to the VCCO Value.

Figure 7:
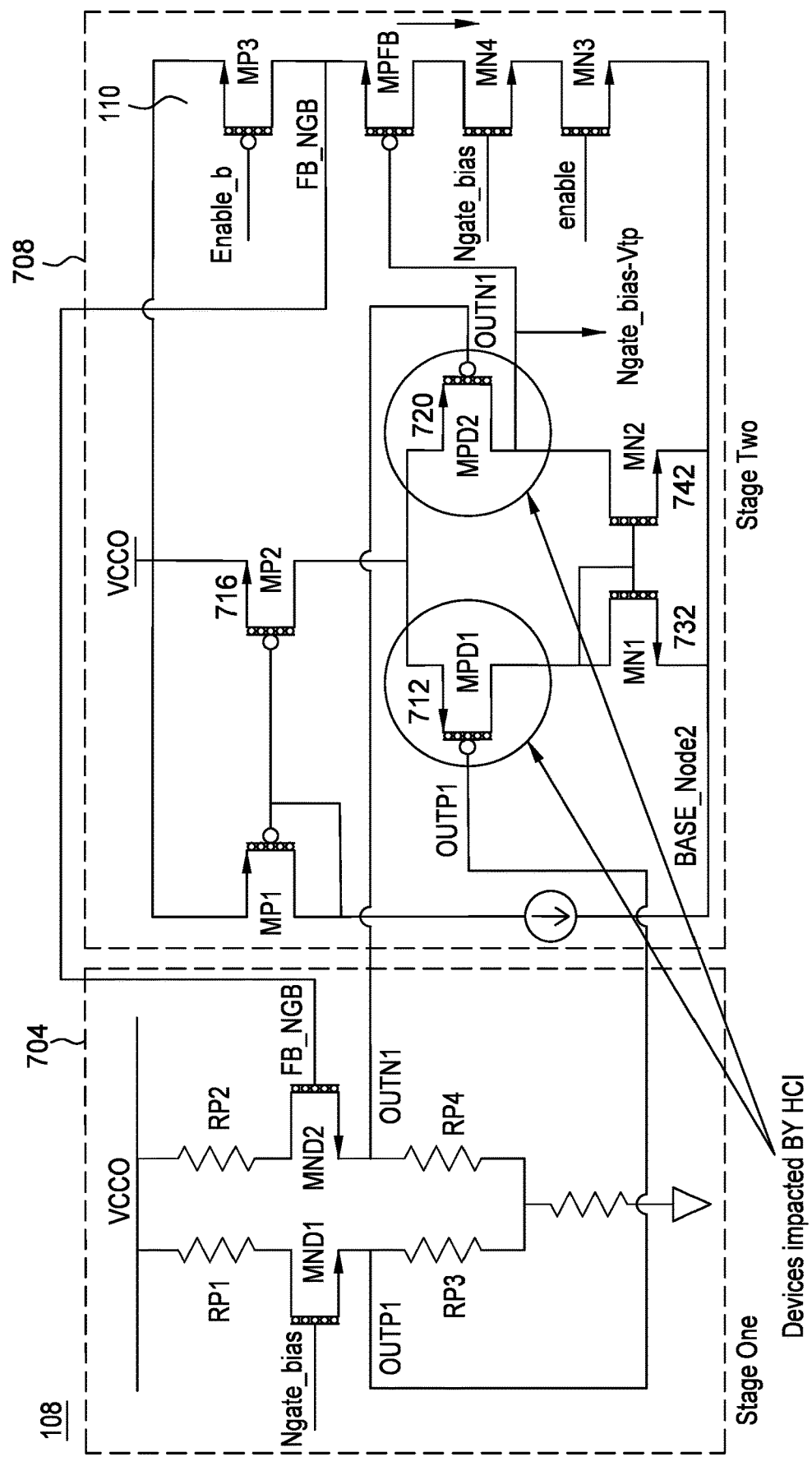
FIG. 7 is a schematic diagram of an example of an Ngate Bias-Vtp Generation circuit.

FIG. 7 illustrates an example, according to one example, of an Ngate Bias−Vtp Generation circuit 108.

The Ngate_Bias−Vtp generation circuit 108 comprises a stage one 704 and a stage two 708. Stage one 704 in this schematic is added to solve the input common mode problem. In a design where there is no stage one 704 and Ngate_Bias is directly connected to MPD1 712, in 2.5 v mode VCCO can go low up to 2.325 v. So the gate of MPD1 is at ~1.8 v. To keep MPD1 712 ON, the source of MPD1 712 should stay at least at 1.8 v+|Vtp|. This creates voltage headroom problem and the current source device (MP2 716) comes out of saturation.

Stage one 704 in this amplifier is introduced to solve this common mode problem. Stage one 704 is a common mode translator circuit. Stage one 704 pushes the common mode voltage down by ~300 mv. The outputs of stage one 704 OUTP1, OUTN1 are fed to stage two 708 (MPD1 712, MPD2 720 respectively). The feedback node FB_NGB is fed back to stage one 704 (gate of MND2). Stage one 704 pushes OUTP1 and OUTN1 to 1.5 v (typical value when Ngate_Bias=1.8 v). Due to the feedback effect, the node FB_NGB settles to 1.8 v (Ngate_Bias) and thereby the gate of MPFB settles to Ngate_Bias–Vtp (desired bias voltage). The HCI problem in stage two 708 is solved using the same method of the Pgate_bias–Vtp amplifier by dynamically changing the BASE_Node2 voltage.

Stage two 708 is described here. Stage two 708 of the Ngate_Bias–Vtp generation circuit 108 resembles Block 104, the Pgate_bias–Vtp generation circuit, with some differences such as the sizing of the transistors and input voltages.

Stage two 708 is a PMOS differential amplifier with NMOS load devices. Transistors MP1 and MP2 716 are the current mirror devices and provide bias current to the differential amplifier. Transistors MPD1 712 and MPD2 720 are the input differential devices which are impacted by the hot current injection (HCI) effect. Transistors MN1 732 and MN2 742 are the load devices. The feed-back is tapped from the source of the MPFB (FB_NGB Net) transistor in the transistor stack 110.

When the differential amplifier is enabled due to the feedback effect of the differential amplifier, the net FB_NGB settles to the value of Ngate_Bias (typical value is 1.8 v). As the source of the MPFB transistor settles at Ngate_bias, the gate of that transistor settles to Ngate_Bias–Vtp which is a desired bias value.

In 2.5 v mode, VCCO can go as low as 2.325 (VCCO–7%), then the Ngate_Bias value=~1.65 v and the drain of MN2=1.65–Vtp (where Vtp is the threshold voltage of the PMOS transistor). To keep the transistor MN2 in saturation, the gate of transistors MN1 732 and MN2 742 should be less than 1.65–Vtp. The gate voltage of MPD1=1.65–0.3 v (Ngate_bias value is ~1.65 for VCCO value of 2.325 v)

$V_{DS}$ of MPD1 should always be less than 1.5 v to mitigate the HCI problem.

In 3.3 volts mode the VCCO can go as high as 3.465 (VCCO+5%). When VCCO–3.465, and under skew process condition the $V_{DS}$ of MPD1 can go up to 1.72V. The $V_{DS}$ limit of a MOS transistor under saturation condition is ~1.5 v. If the $V_{DS}$ of a PMOS transistor crosses 1.5V, the Idsat (i.e. the saturation current of the device) will degrade more than 5% which is the acceptable limit for reliable operation. So to meet the HCI Degradation limits of the MOS transistor, the $V_{DS}$ of the device must be less than 1.5 v. The differential amplifier should be designed in such a way that all the MOS transistors (1.8 v devices), the $V_{DS}$ voltage should be less than 1.5 v. In the Ngate_Bias–Vtp bias amplifier, the transistor MPD1 712 struggles with the HCI effect as its $V_{DS}$ is more than 1.5 v in 3.3 v mode.

To solve this issue in 3.3 v mode, the BASE_Node2 voltage should be maintained at ~200 mv so that the $V_{DS}$ of MPD1 will be less than 1.5 v. If the differential amplifier is designed to keep the BASE_Node2 voltage at least 200 mv, under 2.5 v mode the transistor MN2 742 will be out of saturation. To meet the performance of the differential amplifier without Idsat degradation (due to the HCI effect), the BASE_Node2 voltage should dynamically change according to the supply voltage mode.

Resistor RN2 of 116 of FIG. 1, MOS transistor MN T2 of 116 of FIG. 1 and the VCCO Detect Block 120 of FIG. 1 are used to adjust the BASE_Node2 voltage dynamically (BASE_Node2 voltage=0 v in 2.5 v mode and ~250 mv in 3.3 v Mode). The VCCO Detect circuit 120 detects the voltage mode of the I/O buffer. The 2.5 v_Detect signal is a VCCINT domain signal. Its logic value is equal to "1" when the I/O is in 2.5 Vmode, and its logic value is "0" in 3.3 v mode. In 3.3 v mode the 2.5 v_Detect signal is logic zero and turns off MN T2 of 116 of FIG. 1. Under this condition, the current from the differential amplifier (MN1 732 and MN2 742) flows through RN2, as BASE_Node2 is connected to ground via RN2 of 116 of FIG. 1 which raises the BASE_Node2 voltage. The RN2 value is chosen in such a way that the BASE_Node2 voltage is approximately equal to 250 m (typically) in 3.3 v mode. In 2.5 v I/O mode, the signal 2.5 v_Detect is at logic high and turns on the transistor MN T2 of 116 of FIG. 1.

As the transistor MN T2 is ON, it bypasses the resistor RN2 of 116 of FIG. 1 and keeps the BASE_Node2 voltage approximately at ground value. Due to this dynamic change in the BASE_Node2 voltage, the $V_{DS}$ of all devices (under saturation) are well within the reliability limit and hence the Idsat degradation due to HCI effect is mitigated.

Column 110 illustrates the transistors MP3, MPFB, MN4, MN3. These transistors along with Amplifier 2 form the feedback loop of the amplifier.

Figure 8:
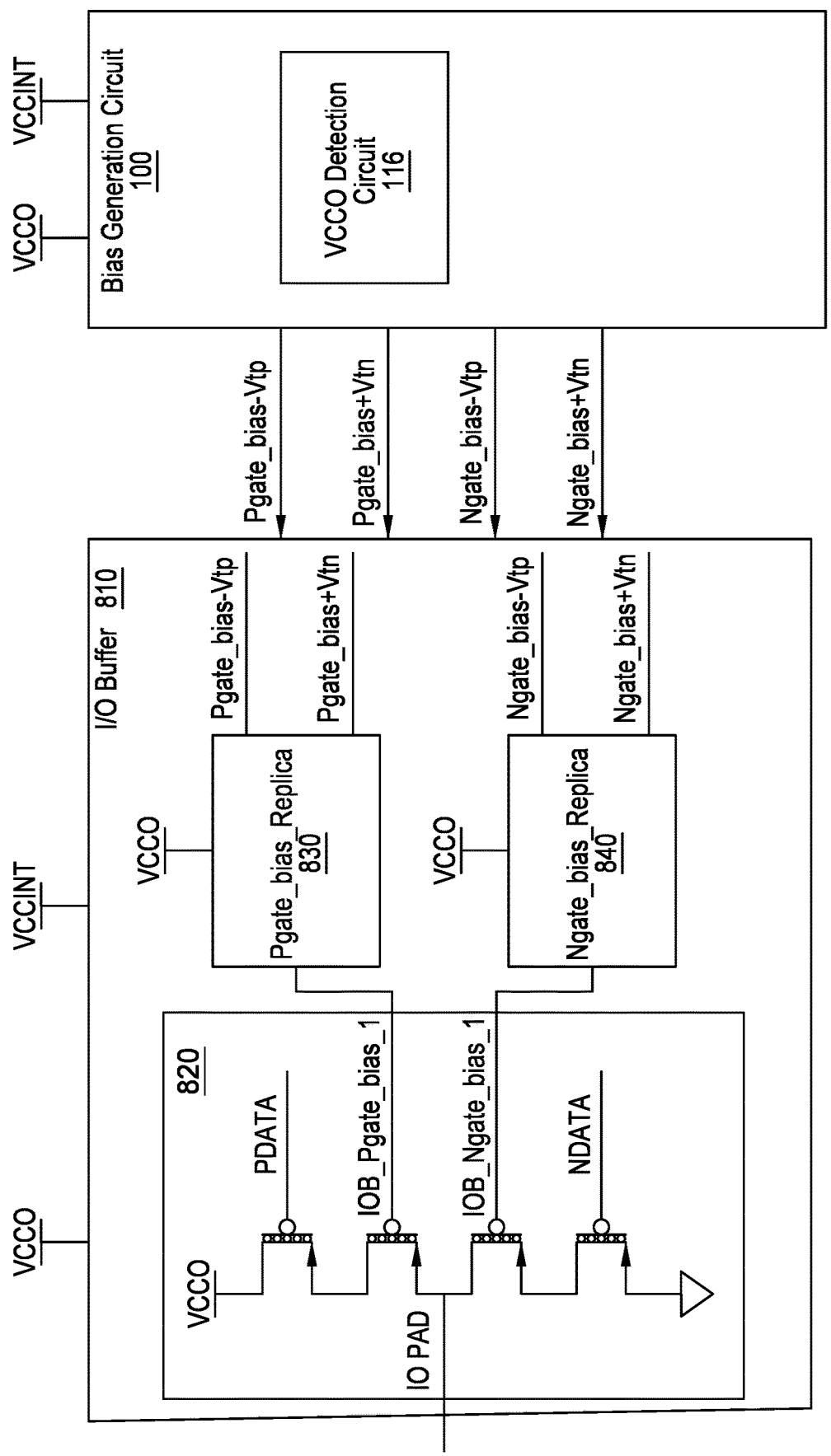
FIG. 8 is a top-level schematic diagram of an example of a Bias Generation Circuit and an I/O Buffer.

FIG. 8 illustrates is a top-level schematic diagram of an example of a Bias Generation Circuit coupled to an I/O Buffer circuit.

The bias generation circuit 100 mitigates the HCI in the bias generation circuit 100 as well as the HCI in the I/O Buffer circuit 810 and in the Driver circuit 820. The bias generation circuit 100, in conjunction with the VCCO Detect circuit 116, generates the four bias signals Pgate_bias–Vtp, Pgate_bias+Vtn, Ngate_bias–Vtp, Ngate_bias+Vtn and transmits the four bias signals to an I/O Buffer circuit 810.

The Pgate_bias_Replica circuit 830 and Ngate_bias_Replica circuit 840 receive power from the VCCO power supply, and supply the IOB_Pgate_bias_1 signal and the IOB_Ngate_bias_1 signal that mitigate the Hot Carrier Injection (HCI) effect in the Driver circuit 820.

The Pgate_bias_Replica circuit 830 comprises a second copy of the Pgate_bias_Replica circuit shown in FIG. 3, block 144. The Pgate_bias_Replica circuit 830 generates the IOB_Pgate_bias signal_1 that is transmitted to the gate of one transistor in the Driver circuit 820.

The Ngate_bias_Replica circuit 840 comprises a second copy of the Ngate_bias_Replica circuit shown in FIG. 3, block 164. The Ngate_bias_Replica circuit 840 generates the IOB_Ngate_bias_1 signal that is also transmitted to the gate of another transistor in the Driver circuit 820.

A Driver circuit 820 comprises a plurality of transistors. The PDATA signal is coupled to the gate of one transistor of the Driver circuit 820. The NDATA signal is coupled to the gate of another transistor of the Driver circuit 820. The transistors in the Driver circuit 820 are coupled to the VCCO power supply and to an I/O Pad.

The I/O Buffer circuit 810 input data and output data are received and transmitted from the IO Pad coupled to the Driver circuit 820.

Testing of the new bias generation circuit indicates that by dynamically changing the BASE_Node1 voltage and BASE_Node2 voltage, the effect of HCI becomes negligible, without any reliability problems. It is clear the biases are well within the specified values (the error is far less than the 30 mv Specification). With the new design disclosed herein, the bias voltages are generated without compromising the reliability of the circuits.

The methods disclosed herein comprise one or more steps or actions for achieving the methods. The method steps and/or actions may be interchanged with one another. In other words, unless a specific order of steps or actions is specified, the order and/or use of specific steps and/or actions may be modified.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, a digital signal processor (DSP), an application specific integrated circuit (ASIC), or a processor (e.g., a general purpose or specifically programmed processor). Generally, where there are operations illustrated in figures, those operations may have corresponding counterpart means-plus-function components with similar numbering.

The various illustrative logical blocks, modules and circuits described in connection with the present disclosure may be implemented or performed with a general purpose processor, a DSP, an ASIC, a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein, for example, instructions for performing the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

While the foregoing is directed to specific examples, other and further examples may be devised without departing from the basic scope thereof, and the scope thereof is determined by the claims that follow.

What is claimed is:

1. A method for mitigating hot carrier injection (HCI) effects in a semiconductor circuit, the method comprising:
    detecting VCCO voltage levels in the semiconductor circuit via a VCCO detection circuit coupled to a plurality of bias generation circuits;
    generating reference node voltages via the VCCO detection circuit, each reference node voltage generated using at least a reference node resistor coupled to a differential amplifier in a bias generation circuit of the plurality of bias generation circuits;
    generating a plurality of bias signals via the bias generation circuits; and
    dynamically adjusting the reference node voltages so as to mitigate the HCI effects in the semiconductor circuit by limiting drain to source voltages of transistors in the semiconductor circuit.

2. The method of claim 1, wherein the VCCO detection circuit is configured to detect high voltage and low voltage VCCO voltage levels.

3. The method of claim 1, wherein the bias generation circuits comprise a plurality of bias voltage resistor divider networks.

4. The method of claim 3, wherein each bias voltage resistor divider network comprises at least 10 resistors.

5. The method of claim 1, wherein the plurality of bias signals comprises four bias signals.

6. The method of claim 1, wherein the semiconductor circuit comprises a common mode translator circuit.

7. The method of claim 1, wherein the semiconductor circuit comprises an I/O buffer.

8. The method of claim 1, wherein current variations from the differential amplifier through the reference node resistor adjust values of the reference node voltages.

9. A system for mitigating hot carrier injection (HCI) effects in an I/O buffer circuit, the system comprising:
    a plurality of bias generation circuits configured to receive power from a VCCO power supply; and
    a VCCO detection circuit, coupled to the plurality of bias generation circuits, wherein the bias generation circuits are configured to dynamically generate reference node voltages, each reference node voltage generated using at least a reference node resistor coupled to a differential amplifier in a bias generation circuit of the plurality of bias generation circuits, to mitigate the HCI effects by limiting drain to source voltages of transistors in the I/O buffer circuit.

10. The system of claim 9, wherein the bias generation circuits comprise at least 10 bias voltage resistors configured to detect high voltage and low voltage VCCO voltage levels.

11. The system of claim 9, wherein the plurality of bias generation circuits comprises four bias generation circuits.

12. The system of claim 9, wherein the reference node voltages are about 250 mV in a 3.3V mode.

13. The system of claim 9, wherein current variations from the differential amplifier through the reference node resistor adjust values of the reference node voltages.

14. A system for mitigating hot carrier injection (HCI) effects in a semiconductor circuit, the system comprising:
    a plurality of bias generation circuits configured to receive a VCCO voltage;
    a VCCO detection circuit coupled to the plurality of bias generation circuits, the VCCO detection circuit including multiple resistor-transistor combinations, where a reference node resistor of the multiple resistor-transistor combinations is coupled to a differential amplifier in a bias generation circuit of the plurality of bias generation circuits; and
    an I/O buffer circuit coupled to the plurality of bias generation circuits.

15. The system of claim 14, wherein the plurality of bias generation circuits are configured to generate a plurality of bias signals that dynamically adjust reference node voltages in the I/O buffer circuit, using the multiple resistor-transistor combinations, so as to mitigate the HCI effects by limiting drain to source voltages of transistors in the semiconductor circuit.

16. The system of claim 15, wherein the plurality of bias signals comprises four bias signals.

17. The system of claim 14, wherein the VCCO detection circuit is configured to detect high voltage and low voltage VCCO levels.

18. The system of claim 14, wherein the plurality of bias generation circuits comprise a plurality of bias voltage resistor divider networks configured to generate bias voltages, wherein each bias voltage resistor divider network comprises at least 10 resistors.

19. The system of claim 14, wherein reference node voltages in the I/O buffer circuit are about 250 mV in a 3.3V mode.

20. The system of claim 14, wherein current variations from the differential amplifier through the reference node resistor adjust values of reference node voltages.

* * * * *